United States Patent
Sato et al.

(10) Patent No.: US 8,778,816 B2
(45) Date of Patent: Jul. 15, 2014

(54) IN SITU VAPOR PHASE SURFACE ACTIVATION OF $SIO_2$

(75) Inventors: Tatsuya E. Sato, San Jose, CA (US); David Thompson, San Jose, CA (US); Jeffrey W. Anthis, San Jose, CA (US); Vladimir Zubkov, Mountain View, CA (US); Steven Verhaverbeke, San Francisco, CA (US); Roman Gouk, San Jose, CA (US); Maitreyee Mahajani, Saratoga, CA (US); Patricia M. Liu, Saratoga, CA (US); Malcolm J. Bevan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 47 days.

(21) Appl. No.: 13/192,041

(22) Filed: Jul. 27, 2011

(65) Prior Publication Data

US 2012/0202357 A1    Aug. 9, 2012

Related U.S. Application Data

(60) Provisional application No. 61/439,686, filed on Feb. 4, 2011.

(51) Int. Cl.
*H01L 21/31* (2006.01)
(52) U.S. Cl.
USPC ....... 438/785; 438/795; 427/444; 257/E21.24
(58) Field of Classification Search
USPC .......................... 438/591, 785, 795; 427/444; 257/E21.24
See application file for complete search history.

(56) References Cited

U.S. PATENT DOCUMENTS

| | | | |
|---|---|---|---|
| 5,543,648 A | * | 8/1996 | Miyawaki ..................... 257/347 |
| 6,090,442 A | | 7/2000 | Klaus et al. |
| 6,124,158 A | | 9/2000 | Dautartas et al. |

(Continued)

FOREIGN PATENT DOCUMENTS

| | | |
|---|---|---|
| KR | 10-2010-0126576 | 12/2010 |
| WO | WO-2012/106612 | 8/2012 |

OTHER PUBLICATIONS

Klaus, J. W. et al., "$SiO_2$ Chemical Vapor Deposition at Room Temperature Using $SiCl_4$ and $H_2O$ with an $NH_3$ Catalyst", *Journal of The Electrochemical Society*, 147(7) 2000, 2658-2664.

(Continued)

*Primary Examiner* — Stephen W Smoot
*Assistant Examiner* — Edward Chin
(74) *Attorney, Agent, or Firm* — Serville Whitney LLC

(57) ABSTRACT

Methods for preparing a substrate for a subsequent film formation process are described. Methods for preparing a substrate for a subsequent film formation process, without immersion in an aqueous solution, are also described. A process is described that includes disposing a substrate into a process chamber, the substrate having a thermal oxide surface with substantially no reactive surface terminations. The thermal oxide surface is exposed to a partial pressure of water below the saturated vapor pressure at a temperature of the substrate to convert the dense thermal oxide with substantially no reactive surface terminations to a surface with hydroxyl surface terminations. This can occur in the presence of a Lewis base such as ammonia.

19 Claims, 3 Drawing Sheets

(56) References Cited

U.S. PATENT DOCUMENTS

| | | |
|---|---|---|
| 6,627,556 B1 | 9/2003 | Aronowitz et al. |
| 6,818,250 B2 | 11/2004 | George et al. |
| 6,818,517 B1 * | 11/2004 | Maes .................... 438/287 |
| 7,384,486 B2 * | 6/2008 | Yang et al. .................. 134/1 |
| 7,476,942 B2 * | 1/2009 | Watanabe et al. .......... 257/370 |
| 7,491,653 B1 | 2/2009 | Papasouliotis et al. |
| 7,494,545 B2 * | 2/2009 | Lam et al. .................. 117/84 |
| 7,608,539 B2 | 10/2009 | Sneh |
| 7,642,140 B2 * | 1/2010 | Bae et al. ................... 438/151 |
| 7,678,422 B2 | 3/2010 | Lei et al. |
| 7,749,574 B2 | 7/2010 | Mahajani et al. |
| 7,837,795 B2 * | 11/2010 | Brabant et al. ............. 117/201 |
| 7,871,942 B2 | 1/2011 | Kher et al. |
| 8,187,970 B2 * | 5/2012 | Ganguli et al. ............ 438/655 |
| 2003/0003635 A1 | 1/2003 | Paranjpe et al. |
| 2004/0221807 A1 | 11/2004 | Verghese et al. |
| 2004/0241067 A1 * | 12/2004 | Oki et al. ................... 423/213.2 |
| 2005/0098906 A1 | 5/2005 | Satoh et al. |
| 2005/0233529 A1 * | 10/2005 | Pomarede et al. .......... 438/287 |
| 2005/0277294 A1 | 12/2005 | Schaeffer et al. |
| 2006/0051929 A1 * | 3/2006 | Jin et al. ................... 438/424 |
| 2006/0073673 A1 | 4/2006 | Verhaverbeke |
| 2007/0036892 A1 * | 2/2007 | Haukka et al. ............. 427/248.1 |
| 2007/0254488 A1 * | 11/2007 | Huotari et al. .............. 438/720 |
| 2008/0142483 A1 * | 6/2008 | Hua et al. ................... 216/67 |
| 2008/0241358 A1 | 10/2008 | Joe et al. |
| 2009/0305515 A1 | 12/2009 | Ho et al. |
| 2010/0222802 A1 * | 9/2010 | Gillespie et al. ............ 606/192 |
| 2010/0239758 A1 | 9/2010 | Kher et al. |
| 2011/0124172 A1 | 5/2011 | Jeong et al. |
| 2011/0256722 A1 * | 10/2011 | Huotari et al. .............. 438/685 |

OTHER PUBLICATIONS

PCT International Search Report and Written Opinion in PCT/US2012/023797, mailed Jul. 31, 2012, 8 pgs.

PCT International Search Report & Written Opinion in PCT/US2012/023778, mailed Sep. 20, 2012, 10 pgs.

PCT International Search Report and Written Opinion in PCT/US2012/023810, mailed Oct. 31, 2012, 10 pgs.

* cited by examiner

IN SITU VAPOR PHASE SURFACE ACTIVATION OF $SIO_2$

CROSS-REFERENCE TO RELATED APPLICATIONS

This application claims the benefit under 35 U.S.C. §119(e) to U.S. Provisional Application No. 61/439,686, filed Feb. 4, 2011.

BACKGROUND

Embodiments of the present invention generally relate to the field of integrated circuit fabrication, and more particularly to methods and apparatus for improving chemical vapor deposition, atomic layer deposition and other chemical reaction techniques.

An important consideration of formation of films on substrate surfaces containing dense metal oxides by chemical reaction techniques such as chemical vapor deposition (CVD) and atomic layer deposition (ALD) is preparation of the metal oxide surface and the initiation process. As discussed herein, these considerations also apply to dense metal oxides such as porous metal oxides (including low-k films), which still need surface treatment techniques without significant penetration of aqueous solution. Surface preparation requires the substrate surface to be chemically activated to promote growth of the initial and subsequent layers on the substrate. The substrate surface can be prepared to provide a dense reactive species, for example, by hydroxylation.

$SiO_2$ (silica) surfaces are not very reactive toward many precursors used in chemical reaction techniques to form layer because these surfaces have no reactive site or "chemical handle". Typically, to make a surface more reactive it must be treated ex situ, that is, outside the process chamber environment, with harsh aqueous solutions such as SC-1 or chemox. These treatments generate surface hydroxyls which provide very good chemical handles for many subsequent precursors. One problem with this surface activation strategy is that it requires an air break from the process chamber(s) that are used to deposit subsequent layers, and this air break inherently leads to carbon contamination and poor device performance. Other problems may include relatively higher etching rate impacting $SiO_2$ film thickness, and penetration of SC-1 aqueous solution to local device structure with porous film requirement. Other methods to activate silica surfaces include plasma treatments which can produce very reactive dangling bonds. Although plasma treatments, can be performed in situ (within the process chamber environment), these plasma treatments are difficult to control and lead to non-uniform surfaces. There is a need to provide methods to provide techniques that can be used in situ in the process chamber environment to provide reactive surfaces on dense thermal oxide surfaces.

SUMMARY OF THE INVENTION

Embodiments of the invention provide in situ chemical techniques which require no air break that provide uniform surfaces and active sites on dense thermal oxide surfaces such as silica and silica-containing films.

In one embodiment, a process for preparing a substrate having a thermal oxide surface for formation of a film on the thermal oxide surface is provided. In a specific embodiment, the method includes converting a dense thermal oxide with substantially no reactive surface terminations to a surface with reactive surface terminations. As used in this specification and the appended claims, the term "substantially no reactive surface terminations" means that less than about 10% of the surface terminations are reactive. In detailed embodiments, the term "substantially no reactive surface terminations" means that less than about 5%, 4%, 3%, 2%, 1% or 0.5% of the surface terminations are reactive. The process is performed in situ in a process chamber. The surface terminations can include hydroxyls, halides or combinations thereof. As used herein, such methods may be applied to films requiring a porous structure (such as low-k films) which still need surface treatment techniques without significant penetration of aqueous solutions. Accordingly, one or more embodiments may include a process for preparing a substrate without immersion in an aqueous solution. In an embodiment, the method comprises exposing the thermal oxide surface to a partial pressure of water below the saturated vapor pressure at the temperature of the substrate. In specific embodiments, the vapor pressure of the water is 20% of the saturated vapor pressure at the temperature of the substrate. In other specific embodiments, the saturated vapor pressure of the water is 40%, 60% or 80% the saturated vapor pressure at the temperature of the substrate.

In one or more embodiments, the process includes simultaneously exposing the thermal oxide surface to a catalyst comprising a gaseous Lewis base in the process chamber, for example gaseous ammonia. In specific embodiments, the concentration of the Lewis base is greater than the concentration of water in the process chamber.

In one or more embodiments, the substrate preparation process is performed in situ in a process chamber. Subsequent film formation processes such as by chemical vapor deposition and/or atomic layer deposition are performed in the same process chamber as the surface preparation process, or in a process chamber in communication with the chamber used in the surface preparation process. Thus, the separate chambers, one for surface preparation of the substrate, and one for formation of the film on the surface-terminated thermal oxide can be arranged in cluster tool, and the substrate can be move between the chambers under load lock in which there is no air break which would expose the substrate to contaminants in the ambient atmosphere.

The foregoing has outlined rather broadly certain features and technical advantages of the present invention. It will be appreciated by those skilled in the art that the specific embodiments disclosed may be readily utilized as a basis for modifying or designing other structures or processes within the scope present invention.

DETAILED DESCRIPTION

One or more embodiments of the invention involves the in situ chemical treatment of thermally grown oxides layers, for example, silica-containing (e.g., pure silica or SiON) layers with a chemical that will produces a chemical "handle" such as surface hydroxyls or surface halides that can further react with subsequent precursors. A non-limiting example of a subsequent precursor is HfCl$_4$, and in one or more embodiments, the chemical treatments provide a SiO$_2$/HfO$_2$ interface.

This invention is not limited to the reaction of HfCl$_4$ with the activated surface, and HfCl$_4$ is provided as an illustrative example. This can invention can be applied to any film that needs to be grown on thermal SiO$_2$. Non-limiting examples of other precursors that could be used according to embodiments of the invention include other metal halides (chlorides, bromides, etc), metal amides, metal alkyls, etc. For example, other metal chlorides could include TaCl$_5$, ZrCl$_4$, and LaCl$_3$.

In specific embodiments, it is desired that the treatment of a SiO$_2$ surface should be done at temperatures less than about 450° C. to leave the structure of the bulk SiO$_2$ film intact. Temperatures less than about 400° C., 300° C., 200° C., 100° C., and 50° C. are also within the scope of the invention, and the phrase "low temperature" refers to temperatures that are below one or more of these values. In a first embodiment, an active surface is provided using gas phase reactants that are chemically strong enough to break the Si—O bonds and form Si—X and SiO—X bonds where X is some reactive group including but not limited to OH or Cl. In a second embodiment, the condensation of two gas phase reactants is used on the surface of the SiO$_2$ which are much more reactive to the incoming precursor. Once the secondary film has been grown on top of the condensed phase, the substrate can be annealed to generate a strong interface between the condensed phase and the SiO$_2$.

Figure 1:
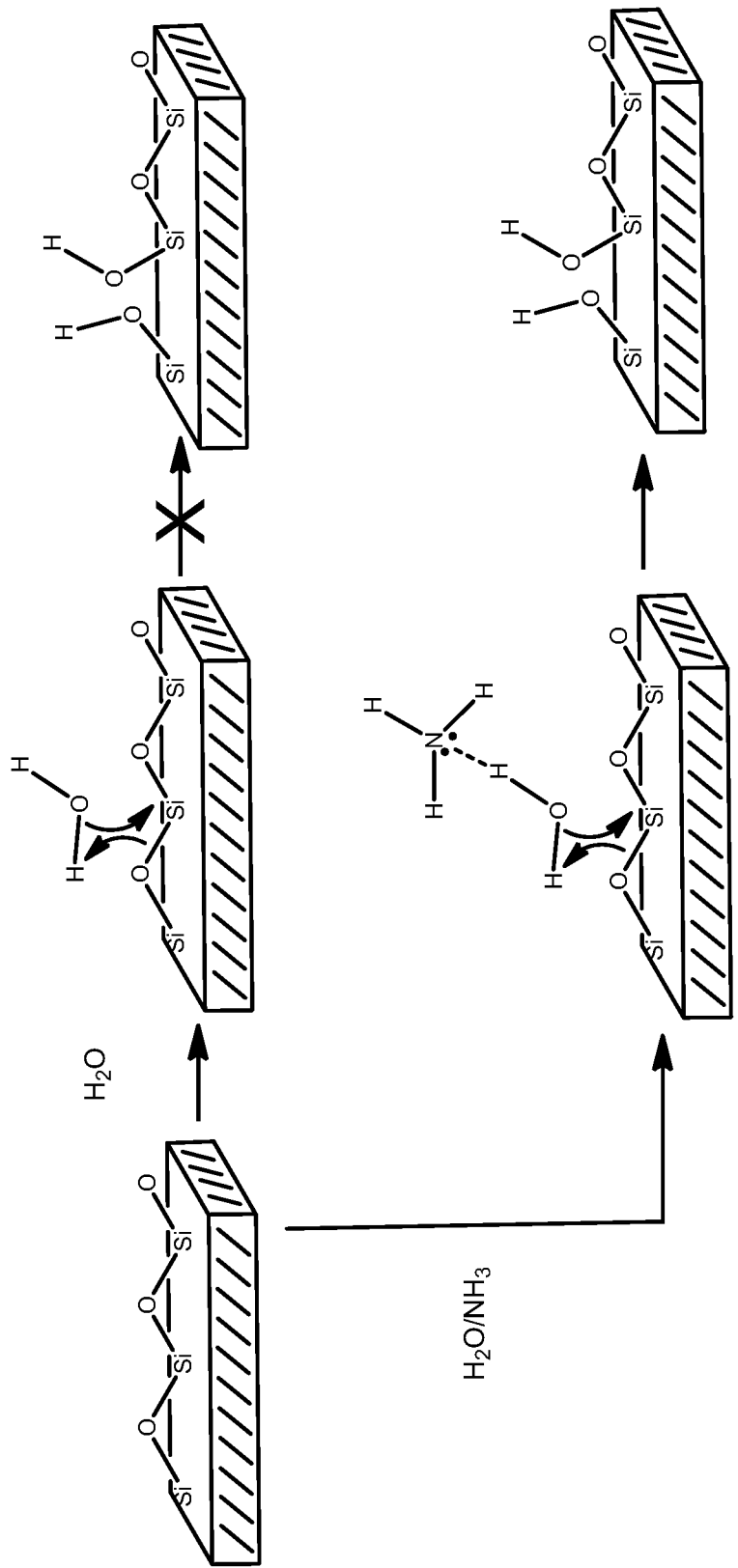
FIG. 1 is a schematic depicting an embodiment of the invention.

FIG. 1 shows the reaction of a SiO$_2$ surface with water with and without an ammonia catalyst. According to one or more embodiments, the ammonia catalyst aids in performing the surface modification at low temperatures. However, the invention is not limited to the use of a catalyst or a specific ammonia catalyst. Other suitable non-limiting examples catalysts include Lewis bases such as conventional alkyl amines or aryl amines of the formula NH$_{3-x}$R$_x$ where R=alkyl or aryl group, pyridine and it derivatives and hydrazines. In embodiments that do not utilize a catalyst, pure H$_2$O vapor, peroxide, HCl and other chemistries can be used that will provide form Si—X and SiO—X bonds on the surface, where X is some reactive group including but not limited to OH or Cl.

FIG. 1 shows the mechanism of water reacting with a SiO$_2$ surface to produce two hydroxyl groups. The upper pathway of FIG. 1 shows that at low temperatures, there is no reaction with water alone. However, according to one or more embodiments, exposure to a water environment of a sufficient duration and at a sufficiently high partial pressure, the reaction pathway may proceed.

The lower pathway in FIG. 1 shows a mechanism when a Lewis base such as ammonia used as a catalyst. As noted above, other combinations of reactants/catalysts could be envisioned in the process. For example, hydrogen peroxide combined with ammonia or hydrazine could lead to Si—OH and Si—O—O—H fragments with the Si—O—O—H fragments being easily reduced to Si—O—H. The thermal oxide surface on a substrate can be halogenated using dihalides followed by ammonia or water to produce Si—OH or Si—X+HX where X=a halogen. In either case, a halogenated surface could easily react with water to produce a Si—OH.

The above processes can be performed under conditions when gas or vapor is flowing into a process chamber or under non-flow conditions. In the case of water vapor, the process results in hydroxylation of the surface. At a concentration of higher than 60% of saturated vapor pressure at the substrate temperature, physisorption of water can take place. Once multiple layers of physisorbed water are present on the substrate surface, it has an ability to dissolve NH$_3$ to produce NH$_4$+ and OH—. Aqueous ammonium hydroxide is believed to react with Si—O—Si bonds resulting in the generation of —OH terminations on the substrate surface.

According to embodiments of the invention, a surface that simulates an surface treated by an ex situ process such as SC1 can be generated in situ using gas phase reactions. This eliminates the need for an air break between the formation of the base oxide and the gate oxide which should eliminate excess carbon. Excess carbon can produce a large hysteresis capacitance value (CV) in high K dielectric films.

As used herein, "in situ" refers to a process that is prepared in a process chamber environment, and not outside a process chamber, where contamination of the substrate surface can occur. In one embodiment, the processes described herein can be performed in a single or stand alone process chamber. In other embodiments, the processes described herein can be performed in a cluster tool under load locked conditions in which there is no air break to move the substrate to subsequent process chambers.

Figure 2:
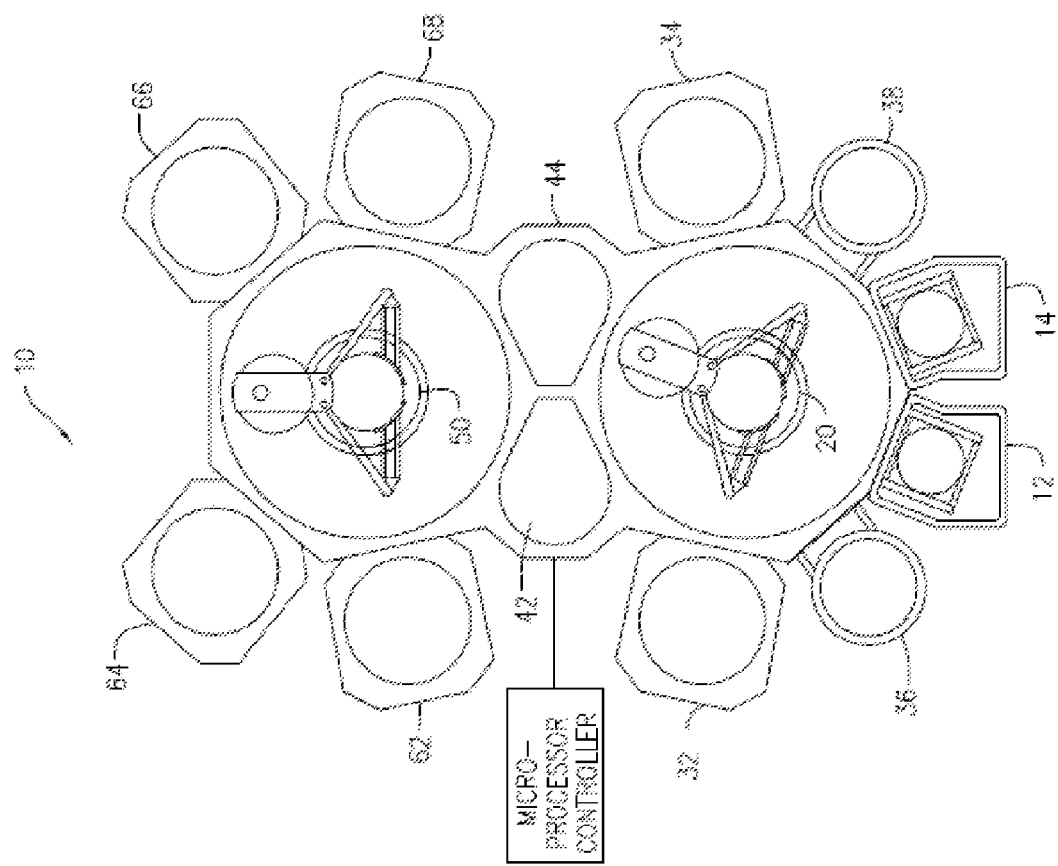
FIG. 2 illustrates a cluster tool according to an embodiment.

FIG. 2 shows an example of a cluster tool or multi-chamber processing system 10 that can be used in conjunction with an aspect of the invention. The processing system 10 can include one or more load lock chambers 12, 14 for transferring substrates into and out of the system 10. Typically, since the system 10 is under vacuum, and the load lock chambers 12, 14 may "pump down" substrates introduced into the system 10. A first robot 20 may transfer the substrates between the load lock chambers 12, 14, and a first set of one or more substrate processing chambers 32, 34, 36, 38. Each processing chamber 32, 34, 36, 38, may be configured to perform a number of substrate processing operations. For example, processing chamber 32 can be an etch processor designed to practice an etch process, and processing chamber 34 can be a deposition reaction chamber for performing ALD or CVD. Processing chambers 36, 38 may also be configured to further provide, for example, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, EUV lithography (e.g. a stepper chamber) and other substrate processes.

The first robot 20 can also transfer substrates to/from one or more transfer chambers 42, 44. The transfer chambers 42, 44 can be used to maintain ultrahigh vacuum conditions while allowing substrates to be transferred within the system 10. A second robot 50 can transfer the substrates between the transfer chambers 42, 44 and a second set of one or more processing chambers 62, 64, 66, 68. Similar to processing chambers 32, 34, 36, 38, the processing chambers 62, 64, 66, 68 can be configured to perform a variety of substrate processing operations, including etch processes, in addition to cyclical layer deposition (CLD), atomic layer deposition (ALD), chemical vapor deposition (CVD), physical vapor deposition (PVD), epitaxial deposition, etch, pre-clean, chemical clean, thermal treatment such as RTP, plasma nitridation, degas, EUV lithography (e.g. a stepper chamber) and orientation. Any of the substrate processing chambers 32, 34, 36, 38, 62, 64, 66, 68 may be removed from the system 10 if not needed.

By carrying out this process in a chamber on a cluster tool, we can avoid surface contamination of the substrate with atmospheric impurities and at the same time maintain the benefits of increased nucleation from a wet chemical treatment.

Figure 3:
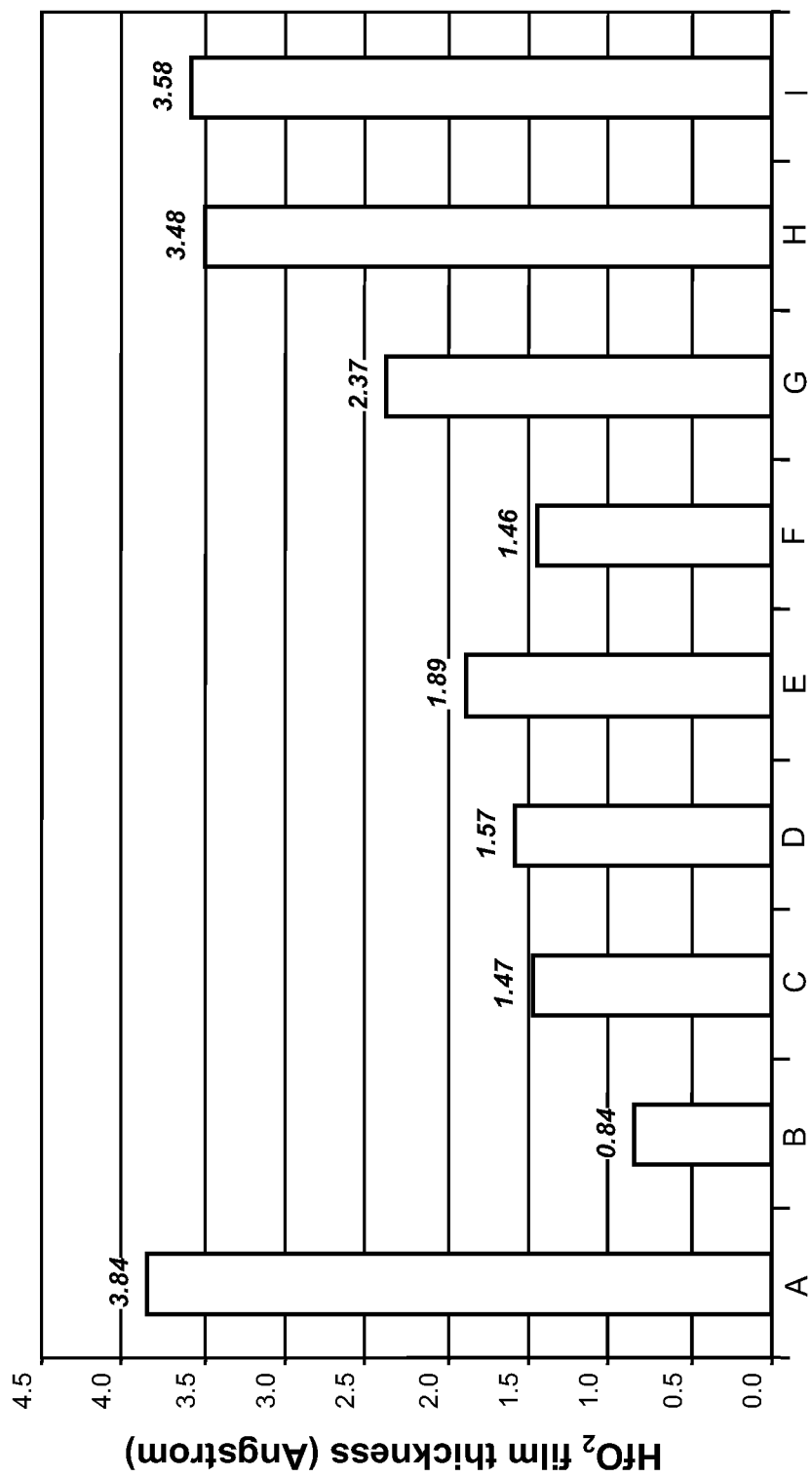
FIG. 3 is a graph showing the effect of various in situ surface treatments compared to an ex situ treatment.

FIG. 3 shows the differences in growth rates as a function of different surface treatment conditions. Sample HfO$_2$ films were grown using an ALD techniques on silicon oxide films.

For sample preparation, Bare-Si wafers were sequentially processed through Steps 1 through Step 4, as shown in FIG. 3. Steps 2 to Step 4 were processed without air break or exposure to air. After samples were processed, $HfO_2$ films thickness were quantified by X-ray Photoelectron Spectroscopy system. Process condition details are as follows and as summarized in Table 1:

Step 1: Each wafer for Samples A-I were etched using dilute HF, followed by SC-1 ($NH_4OH$, $H_2O_2$ and $H_2O$) solution bath treatment at 50° C. for 8 minutes in wet bench system.

Step 2: Each wafer underwent a 10 Angstrom Dry Thermal Oxidation process at 900° C., in air $O_2$ at a pressure of 4 Torr for 15 seconds, as indicated in FIG. 3.

Step 3: Surface treatments were performed on each wafer, as indicated in FIG. 3. As shown in FIG. 3, Samples C, D and E underwent surface treatment with $H_2O$ only and Samples F, G, H and I underwent surface treatment with $H_2O$ in conjunction with $NH_3$. The $H_2O$ condition is described as relative humidity, which is a percentile ratio of $H_2O$ partial pressure over $H_2O$ saturation pressure at specific temperature. For $H_2O$ and $NH_3$ treatment, $NH_3$ partial pressure is equivalent to $H_2O$ partial pressure which is described as relative humidity ("RH").

Step 4: Each wafer underwent an ALD hafnium oxide ($HfO_2$) process with hafnium tetrachloride ($HfCl_4$) and $H_2O$ chemistries. Specifically, 5 cycles of following sequence were given at 275° C. $HfCl_4$ gas exposure—Inert purge—$H_2O$ gas exposure—Inert purge. All samples shown in FIG. 3 received the same ALD process.

TABLE 1

Summary of Process Conditions and Steps

| Sample | A | B | C | D | E | F | G | H | I |
|---|---|---|---|---|---|---|---|---|---|
| Step 1 | Wet Clean | Wet Clean | Wet Clean | Wet Clean | Wet Clean | Wet Clean | Wet Clean | Wet Clean | Wet Clean |
| Step 2 | — | 10 $SiO_2$ | 10 $SiO_2$ | 10 $SiO_2$ | 10 $SiO_2$ | 10 $SiO_2$ | 10 $SiO_2$ | 10 $SiO_2$ | 10 $SiO_2$ |
| Step 3 | — | — | $H_2O$ (10% RH) | $H_2O$ (60% RH) | $H_2O$ (100% RH) | $H_2O$ & $NH_3$ (0.5% RH) | $H_2O$ & $NH_3$ (10% RH) | $H_2O$ & $NH_3$ (60% RH) | $H_2O$ & $NH_3$ (100% RH) |
| Step 4 | $HfO_2$ ALD | $HfO_2$ ALD | $HfO_2$ ALD | $HfO_2$ ALD | $HfO_2$ ALD | $HfO_2$ ALD | $HfO_2$ ALD | $HfO_2$ ALD | $HfO_2$ ALD |

Sample A in FIG. 3 shows the thickness of a film after 5 cycles of ALD of a wafer that has been treated by a wet chemistry ex situ technique. Sample B in FIG. 3 shows film thickness of a film after 5 cycles of ALD on a dense thermal oxide, silicon oxide. The difference in thickness between Sample A and B is attributed to a lack of nucleation sites to start growth on untreated silicon oxide. The thickness data for Samples C through I show the different thickness of films obtained after 5 cycles using the different surface treatment conditions listed in Table 1. The differences in thickness demonstrated in FIG. 3 between Sample B and Sample H or Sample I show the benefit of this embodiment of the invention.

Thus, according to one or more embodiments of the invention, a process is provided in which a substrate containing a dense thermal oxide surface having limited or no receptive surface terminations such as hydroxyl surface terminations is treated in a process chamber in situ to provide surface terminations so that a subsequent film formation process (also referred to as a subsequent film deposition process) can be performed on the substrate surface. These surface terminations can by a hydroxyl or halide surface termination. In one or more embodiments, a dense thermal oxide surface such as silicon oxide is surface treated to functionalize the surface without substantially changing the thickness of the substrate. As used in this specification and the appended claims, the term "without substantially changing the thickness" means that the thickness does not change by more than 10 angstroms, or by more than 5 angstroms, or by more than 4 angstroms, or by more than 3 angstroms.

While embodiments of the invention have been described with respect to silicon oxide surfaces, other silica-containing surfaces can be modified in accordance with embodiments of the invention. For example, a SiON surface can also be modified in accordance with embodiments of the invention. The surface treatments can be performed in situ in a CVD or ALD chamber such as a high K ALD chamber.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

The invention claimed is:

1. A method of providing surface terminations on a surface of a substrate for subsequent film formation, the method comprising:
   disposing a substrate having a thermal oxide surface having Si—O—Si bonds in a process chamber; and
   exposing the surface of the thermal oxide having Si—O—Si bonds to a gas containing at least one of a halide and a hydroxide at a temperature below 450° C. such that at least a portion of the Si—O—Si bonds are converted to halide surface terminations or hydroxyl surface terminations on the thermal oxide surface, the gas comprising water at a partial pressure above 20% of the saturated vapor pressure and less than the saturated vapor pressure.

2. The method of claim 1, further comprising depositing a film on the thermal oxide having halide surface terminations or hydroxide surface terminations.

3. The method of claim 2, wherein the method is performed in process chamber without an air break to expose the substrate to air.

4. The method of claim 3, wherein the method is performed in more than one process chamber in a cluster under load lock.

5. The method of claim 1, wherein the surface termination comprises hydroxyl groups and the gas comprises water vapor.

6. The method of claim 5, further comprising exposing the thermal oxide to a catalyst simultaneously with exposure to the water vapor.

7. The method of claim 6, wherein the catalyst comprises a Lewis base.

8. The method of claim 7, wherein the Lewis base is selected from ammonia, pyridine, hydrazine, alkyl amines and aryl amines.

9. The method of claim 1, wherein the substrate is not immersed in an aqueous solution.

10. A method of providing hydroxyl surface terminations on a substrate for a subsequent film formation processing, the method comprising:
   disposing a substrate into a process chamber, the substrate having a thermal oxide surface having Si—O—Si bonds; and
   exposing the thermal oxide surface having Si—O—Si bonds to a partial pressure of water below the saturated vapor pressure and above 20% of the saturated vapor pressure at a temperature of the substrate to convert at least a portion of the Si—O—Si bonds on the thermal oxide surface to hydroxyl surface terminations.

11. The method of claim 10, wherein the partial pressure is above 80% of the saturated vapor pressure at the temperature of the substrate.

12. The method of claim 10, further comprising simultaneously exposing the thermal oxide surface to gaseous ammonia.

13. The method of claim 12, wherein the ammonia is at a concentration equal to or less than concentration of water in the process chamber.

14. The method of claim 10, further comprising performing a subsequent film formation process in a process chamber in communication with the process chamber in which the substrate is provided with hydroxyl surface terminations, and the process chambers are part of a cluster tool.

15. The method of claim 14, wherein the film is a high K dielectric film.

16. The method of claim 15, wherein the film comprises hafnium oxide.

17. The method of claim 16, wherein the film is formed by atomic layer deposition.

18. A method for processing a surface of a substrate, the method comprising:
   etching the surface of the substrate to provide an etched substrate;
   forming a thermal oxide layer having Si—O—Si bonds on the surface of the substrate;
   exposing the surface of the thermal oxide having Si—O—Si bonds to a gas containing at least one of a halide and a hydroxide at a temperature below 450° C. such that at least a portion of the Si—O—Si bonds are converted to halide surface terminations or hydroxyl surface terminations on the thermal oxide surface, the gas comprising water at a partial pressure above 20% of the saturated vapor pressure and less than the saturated vapor pressure; and
   depositing a high K dielectric film on the surface with halide or hydroxyl terminations.

19. The method of claim 18, wherein the substrate is not exposed to air between the thermal oxide layer formation step and the high K dielectric film deposition step.

* * * * *